United States Patent [19]

Alemanni

[11] 4,409,733
[45] Oct. 18, 1983

[54] MEANS AND METHOD FOR PROCESSING INTEGRATED CIRCUIT ELEMENT

[75] Inventor: James C. Alemanni, Oceanside, Calif.

[73] Assignee: Integrated Machine Development, Escondido, Calif.

[21] Appl. No.: 228,603

[22] Filed: Jan. 26, 1981

[51] Int. Cl.³ .................. H01R 43/00; B23P 23/00
[52] U.S. Cl. .................................. 29/827; 29/564.3; 29/588
[58] Field of Search ............. 29/588, 891, 827, 33 M, 29/564.2, 577 R, 564.1, 564.3, 564.6, 33 K; 179/52 PE, 52 FP; 357/70

[56] References Cited

U.S. PATENT DOCUMENTS

| | | | |
|---|---|---|---|
| 3,668,750 | 6/1972 | McAllister et al. | 29/564.2 X |
| 3,793,714 | 2/1974 | Bylander | 29/588 X |
| 3,859,718 | 1/1975 | Noe | 29/588 X |
| 4,100,675 | 7/1978 | Landsittel | 29/827 |
| 4,214,364 | 7/1980 | St. Louis et al. | 29/827 |
| 4,232,815 | 11/1980 | Nakano et al. | 357/70 X |

*Primary Examiner*—Howard N. Goldberg
*Assistant Examiner*—Carl J. Arbes
*Attorney, Agent, or Firm*—Duane C. Bowen

[57] ABSTRACT

Processing of an integrated circuit element singly formed within an integral flat pack frame by shearing the element from the frame and inserting the element in a testing and shipping carrier in a selected clocked orientation, all in a continuous cycle of operation from start to finish. A frame receiving nest and abutments thereto are used in clocking of the integrated circuit element. An arm holds the element by a vacuum during transfer of the separated element from cutting station to packing station. The carrier has opposed lugs, for integrated circuit element engagement, which are spread at the time the element is packed in the carrier and then are released to secure the integrated circuit element in place in the carrier. Strip or reel feed of frames is an option.

20 Claims, 26 Drawing Figures

MEANS AND METHOD FOR PROCESSING INTEGRATED CIRCUIT ELEMENT

BRIEF SUMMARY OF THE INVENTION, BACKGROUND AND OBJECTIVES

My patent application relates to removing integrated circuit elements from flatpack frames and inserting them into carriers.

It has been the practice in the past to accomplish the above in several separate operations. Initially, the singly formed integrated circuit flatpack frame was placed into a cutting fixture which severed the supporting portion of the frame feeding the testable integrated circuit flatpack. Multiples of the frame, generally up to six, could be placed into the cutting fixture. The severed integrated circuit flatpack and the frame remnants were then placed bulk into a suitable box or container. At a separate station, the individual integrated circuit flatpacks were removed from the container using either tweezers or fingers. The electrical polarity requirements were visually verified and the flatpack then placed into the appropriate carrier. The filled carrier was then placed into a bulk bin or container ready for subsequent operations. There were two distinct problems with this procedure. The most serious was the potential physical damage to the severed integrated circuit flatpack which was constructed to specific physical dimensions permitting uniform assembly procedures by the end user of the product. Sufficient physical deformation of the integrated circuit flatpack when being placed into the carrier could render the integrated circuit flatpack unusuable by the end user. The visual verification of the physical characteristic for electrical polarity was tedious and error productive.

The electrical polarity of the device determined the physical placement of the integrated circuit flatpack into its carrier. Erroneous placement would be detected as an electrically rejected integrated circuit flatpack in subsequent electrical testing.

It is an object of this invention to provide a method and apparatus for performing these processes at a single station requiring one operator. By virtue of this condition, the reduced physical handling of this integrated circuit component will have a significant impact in increasing the yield and a general improvement in the overall physical condition of the component. Additionally, it is an object to reduce the error condition of placing the integrated circuit component in the test carrier with improper electrical polarity. This is accomplished by use of a receiver nest that can detect improper placing of the integrated circuit flatpack frame in the machine. The machine will not operate when a frame is not correctly positioned in the nest.

An additional object, and certainly not the least is a significant increase in productivity. The use of a single coordinated machine to perform the described tasks will increase production up to eighteen times the current production levels. Through use of the basic system which involves one at time placement of the integrated circuit flatpack frame, production is increased up to five (5) times that of the current process. Additions to the system of the use a frame clip, a strip or a reel increase the production capabilities to the eighteen times levels of productivity. Further objectives and advantages of my invention wil be understood from the following description, read with reference to the drawings.

SPECIFIC DESCRIPTION

I will first briefly summarize my system. By means of an integral electro-mechanical assembly system consisting of an electric motor driver, through a series of timing belt driven mechanical subassemblies, the electrically testable portion of a singly formed integrated circuit flatpack frame is removed and inserted into a suitable storage, test or shipping container or carrier. The singly formed integrated circuit flatpack frame is initially placed into a receiver nest or fixture. The frame is then severed by use of hardened steel or carbide blades leaving the electrically testable integrated circuit flatpack capable of being extracted from the nest through the use of a vertically moving linear acting vacuum device. The linear motion of the vacuum device transports the extracted integrated circuit to a remote position within the system where a carrier has been presented for use. The carriers may be fed from a magazine which holds a quantity of the carriers or through the feeding mechanics provided by a bulk type feeder such as a vibratory bowl. The electric motor driven system functions on a single cycle basis, each cycle being initiated by the operator who presents the integrated circuit flatpack frame to the system. Each cycle initiated advances the previously filled carrier and presents an empty carrier for the current cycle.

This invention relates in general to a semi-automatic or automatic machine permitting the severing of the integrated circuit flatpack frame causing the frame to be touched only once at the time of placing in the nest. The severed testable integrated circuit flatpack is not handled other than by the machine. This also applies to the carrier which is automatically presented to the machine once it is placed in the machine magazine or the bulk feed system. Each cycle of the machine completes a required process in the semi-conductor manufacturing industry of severing the testable integrated circuit from its frame and inserting it into the container or carrier provided. Additional capabilities of the automatic system include bulk exit or replacing of the filled integrated circuit carrier into a storage or shipping type magazine as part of the operating cycle. The integrated circuit frame can be presented to the system from a previously filled clip or magazine eliminating the need for operator initiated single cycle operation. The integrated circuit frame can also be presented to the system in an indexing feed system when the frame is not singly formed but rather is in a typical series of two or more connected frames known as a strip or reel.

I will next give a more detailed description of operating parts and operations.

Figures 1, 1A, 2:
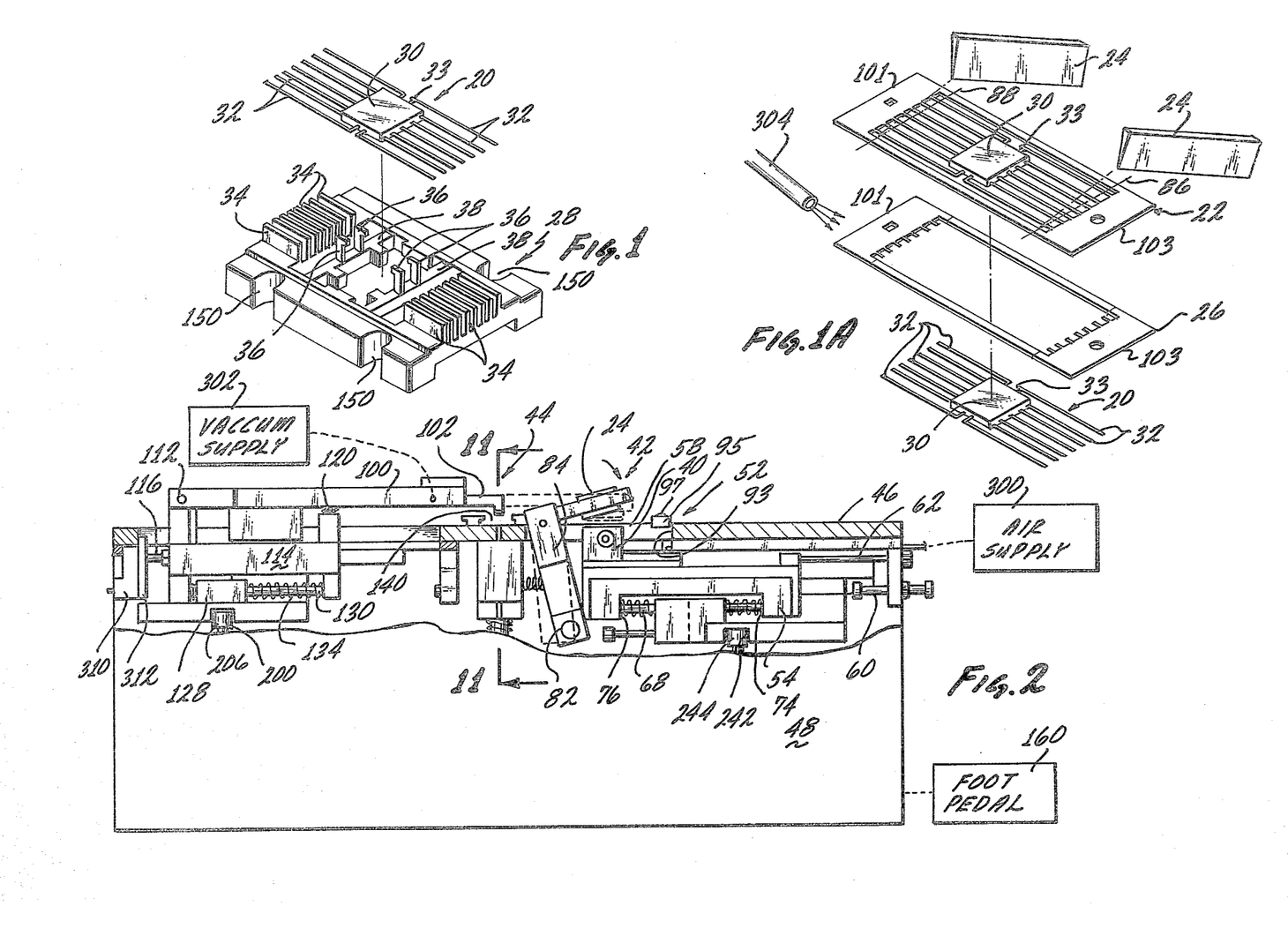
FIG. 1 is an exploded perspective view showing an integrated circuit element (separated from a flatpack frame) and a carrier for that separated integrated circuit element.
FIG. 1A is a view of an integrated circuit element being separated from an integral flatpack frame by cutting blades.
FIG. 2 is an elevational view of a specific embodiment of my invention. Portions are broken away and shown in section.

Referring to FIG. 1A, my invention concerns manufactured items which become separated integrated circuit elements 20 in the course of my process, meaning each item is changed from its manufactured condition as part of an integral flatpack frame 22 by shearing with blades 24 (symbolized in FIG. 1A) into the discarded frame elements 26 (which are blown away) and the remaining separated integrated circuit element 20. Further, as indicated in FIG. 1, my invention concerns packing or loading the separated integrated circuit element 20 into a storage and test carrier 28.

Separated integrated circuit elements 20 includes a central integrated circuit instrumentality 30, which is usually encased in a Military quality ceramic covering. Instrumentality 30 can be as simple as a single function such as capacitance or as complicated as a microcomputer of great complexity. Commonly there will be 10 to 24 leads 32 from instrumentality 30.

The storage and test carrier 28 shown is a standard one-piece carrier, but two-piece carriers are also used, wherein a second locking piece is placed on top of an integrated circuit element 20 after it is packed into a lower section. Carrier 28 has a series of upstanding fins 34 which protect leads 32 that fit between fins 34. Carrier 28 also has opposed lugs 36 mounted on spaced parallel bars 38. During packing of integrated circuit element 20 in carrier 28, bars 38 are spread. When bars 38 are released, lugs 36 engage opposite edges of central instrumentality 30 to hold element 20 in place within carrier 28.

As before indicated, it has been common practice in the past to accomplish the above processing by the following procedure:

(1) By hand, picking up frames 22 from bulk storage.
(2) Examining frames 22 and clocking them. Clocking of frames 22 can be indicated by dots or by the shortest leads 32 or by other structure, such as a bend in a lead at 33.
(3) Next, manually inserting frames 22 in a fixture under blades 24 in proper clocked orientation and shearing the same to form discarded frame elements 26 and separated integrated circuit elements 20.
(4) Dumping elements 20 in a bulk bin.
(5) At another station, manually picking up elements 20 from the bulk bin, orienting and clocking elements 20, and putting elements 20 in carriers 28.

The above process is not only very time-consuming but also there can be considerable damage to elements 20 and especially to leads 32 in steps (4) and (5) above.

In my process and equipment the above procedures are automated so that once frames 22 are clocked at the beginning of the process, that orientation is maintained until elements 20 are packed in carriers 28, the various procedures are powered, and the leads 32 of integrated circuit elements 20 are substantially protected between the time of separation from discarded frame elements 26 until insertion into carrier 28, thus saving time and materials and reducing production of damaged or faulty parts.

Frames 22 and separated integrated circuit elements 20 can be considered to have various fixtures, locations or stations including the receiving nest 40, the cutting station 42, and the packing station 44. The equipment may be housed or mounted in or on a structure including a table top 46, sides 48 and a bottom or base 50.

Nest 40 should be shaped to receive integral flatpack frame 22 in a manner adequately supporting frame 22 and only receiving frame 22 in the proper clocked position as will be described more thoroughly later in this description. Nest 40 moves between its initial receiving location 52 and cutting station 42. Nest 40 is mounted on a block 54 which is movably supported for movement of nest 40 in a table slot 58 between location 52 and station 42 by the double slide antifrictional support 56 viewed particularly in FIG. 9A.

Figures 8, 20:
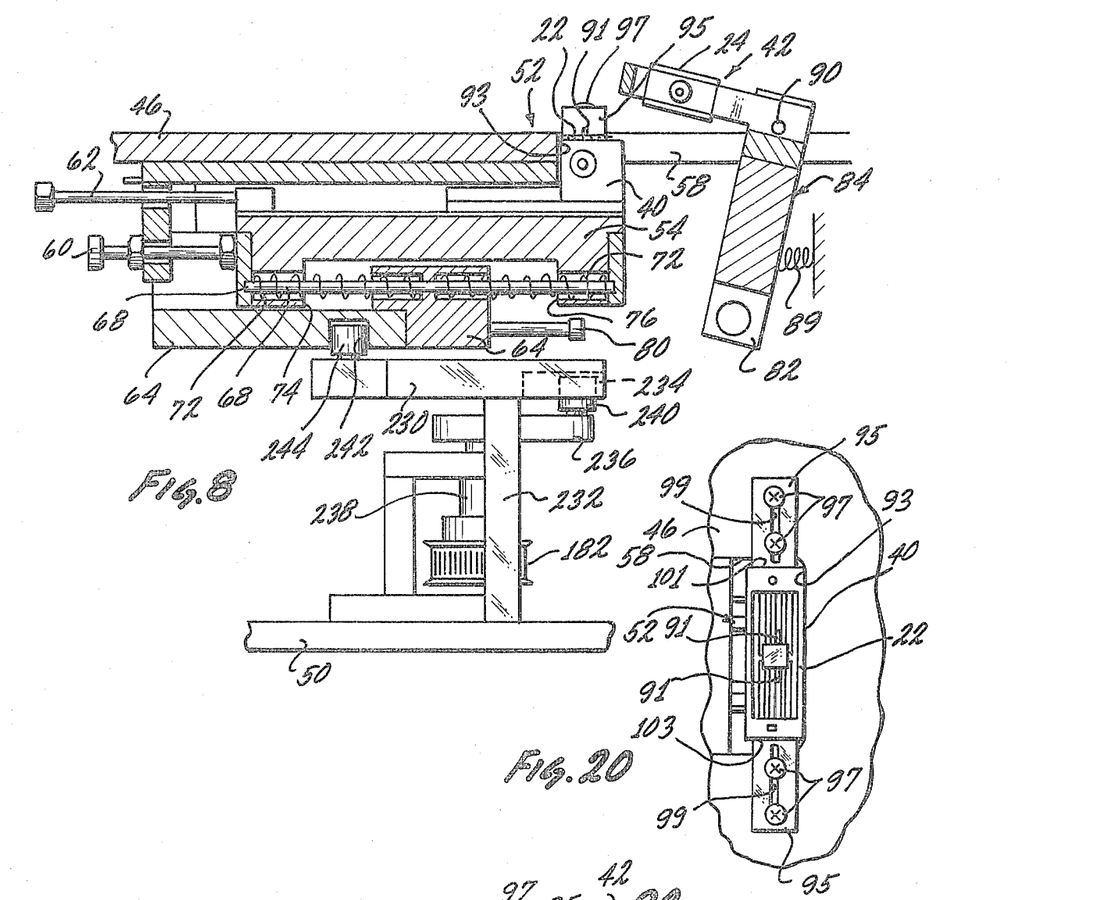
FIG. 8 is an elevational view taken partly in section taken on line 8—8 of FIG. 3.
FIG. 20 is a partial plan view of the nest and of guides for an integral flatpack frame thereon.
Figure 9:
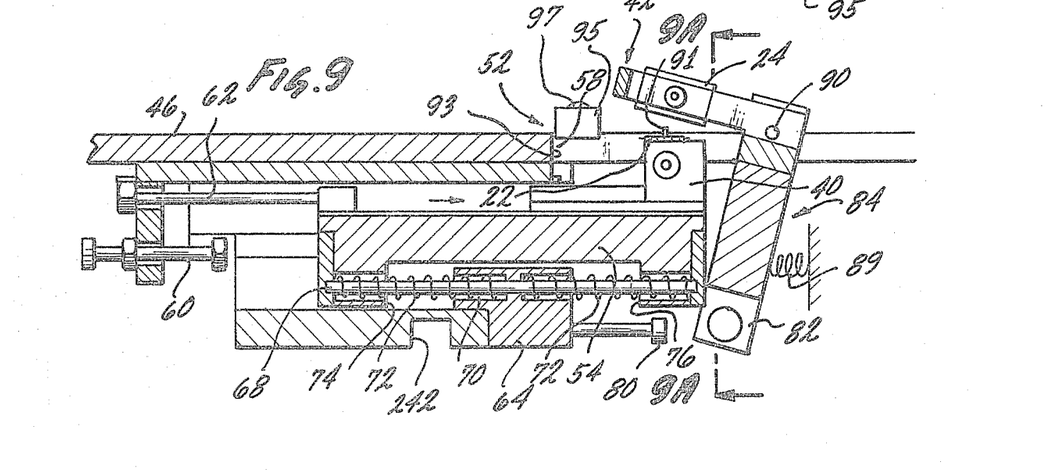
FIG. 9 is a view somewhat like FIG. 8 but with parts in a different position.
Figures 9A, 19:
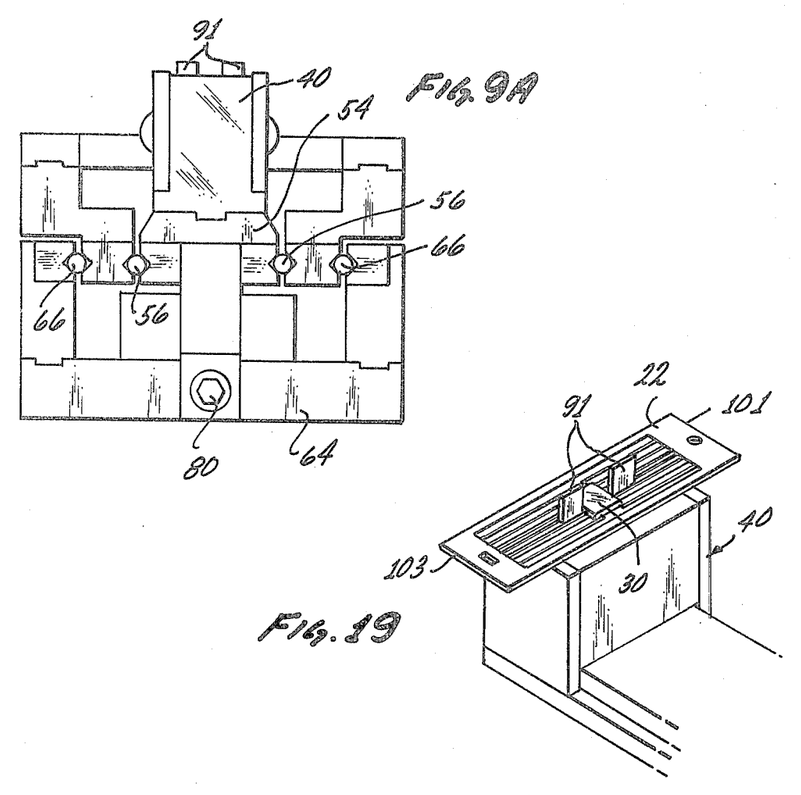
FIG. 9A is an elevational view taken partly in section on line 9A—9A of FIG. 9.
FIG. 19 is a perspective view of the nest and an integral flatpack frame thereon.

In FIG. 8, nest 40 is to the left as viewed in slot 58 substantially at the initial receiving location in which block 54 is limited in further leftward movement by stop 60, which will be recognized to be adjustable by threaded mounting. The extreme position of nest 40 to the right is viewed in FIGS. 9 and 10, in which nest 40 is at the cutting station 42. FIG. 9 is the same position of nest 40 as FIG. 10 but the cutting mechanism 84 is at a different point in its cycle. In the FIGS. 9 and 10 positions of nest 40 and block 54, stop 62 restrains these parts from further rightward movement.

An undercarriage 64 is supported by double antifrictional slide supports 66. A rod 68, supported by block 54, extends through an opening 70 in undercarriage 64 and compression springs 72 on rod 68 on either side of opening 70 tend to center opening 70 on rod 68 but permits lost motion there between. Limits on relative movement between block 54 and undercarriage 64 occurs when undercarriage structure abuts block structures at 74 and 76 at the ends of rod 68. In the FIG. 10 position, with undercarriage 64 abutting block 54 at 76, pusher 80 strikes arm structure 82 on cutting or shearing means 84 to pivot the same to shear element 20 from frame 22. As will later appear, motion is given to the foregoing assembly by force applied to undercarriage 64, which is transmitted through the action of springs 72 or abutments 74, 76 to move block 54, which carries nest 40 between its initial receiving location 52 and cutting station 42.

Cutter 84 has blades 24 that shear element 20 from frame 22. Usually there will be only two blades 24 because the configuration of frame 22 commonly is such that when cuts are made on the lines 86, 88 indicated in FIG. 1A, frame portions 26 are separated and may be blown away. Cutter 84 is pivotally mounted at 90.

Figure 10:
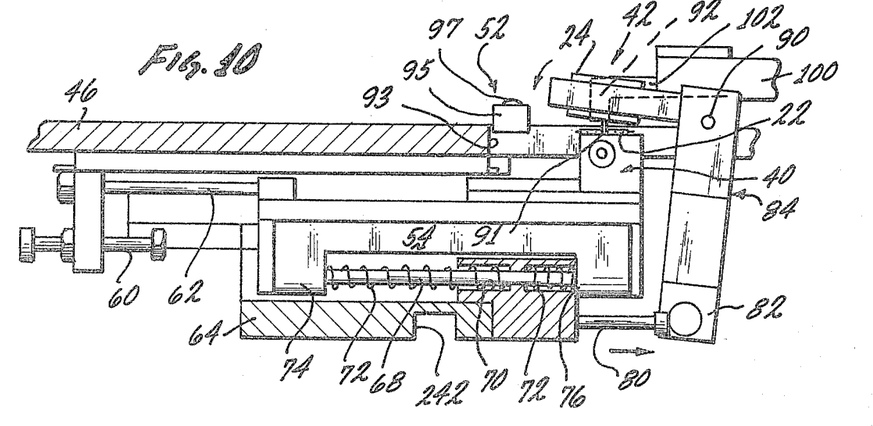
FIG. 10 is similar to FIG. 9 but with parts in a different position.

Cutter 84 acts to shear integral flatpack frame 22 by pivoting during the cycle illustrated in FIGS. 8, 9, and 10 in which, respectively, frame 22 is loaded in nest 40, nest 40 is moved rectilinearly to cutting station 42, and cutter 84 is pivoted to shear frame 22 on lines 86, 88 when pusher 80 on undercarriage 64 strikes arm 82. The cutting mechanism 84 is configured with an open center 92. A spring 89 normally presses cutting mechanism 94 to the inactive position depicted in FIGS. 8 and 9.

Nest 40 may include a pair of upstanding blades 91 that fit between leads 32 at either side of central instrumentality 30. The adjacent end edge 93 of slot 58 in table 46 determines which pairs of leads 32 blades 91 fit between, which is to say that the distance between edge 93 and the plane of blades 91 when nest 40 is at its home position (as far as it can go to the left in FIG. 8) will determine which pairs of leads the blades will fit between when the operator abuts frame 22 to edge 93. Member 60 symbolizes an adjustable stop for carriage 54 which can be adjusted to vary the spacing between the plane of blades 91 and the plane of edge 93. Abutments 95 are indicated to be adjustable by screws 97 fitting in slots 99 and threaded into openings in table top 46. These abutments 95 abut the ends of frame 22. The distance from one end 101 of frame 22 to central instrumentality 30 is 0.040" greater than the distance from the other end 103 of frame 22 to central instrumentality 30, which means that frame 22 will only fit in nest 40 in one clocked position when end abutments 95 are adjusted so that the distance to adjacent blades 91 are spaced 0.040" differently, i.e., one abutment 95 is spaced from blades 91 the distance from end 101 of frame 22 to center 30 and the other abutment 95 is spaced from blades 91 the distance from end 103 of frame 22 to center 30. By this configuration of nest 40, blades 91, slot edge 93, and abutments 95, the operator can position the part (frame 22) in the desired initial location and with the desired initial clocking, which will determine that element 20 will be properly located and oriented eventually for packing in carrier 28.

I will next describe the mechanism to transfer separated integrated circuit element 20 from cutting station 42 to packing station 44, which is illustrated especially in FIGS. 5, 6, 6A, 6B, and 7. A transfer arm 100, having a depending finger 102 at one end, is moved in a cycle of operation as follows:

(a) When integral flatpack frame 22 has been moved in nest 40 to cutting station 42, and before shearing by blades 24 has occurred, arm 100 has moved finger 102 over above nest 40, at cutting station 42, and has inserted finger 102 down through open center 92 of cutting frame means 84 to bear on central integrated circuit instrumentality 30 to hold element 20 in place during the shearing operation, as shown in FIG. 10. Finger 102 has an end opening 104 in a resilient silicone rubber tip 106 and there is a vacuum passage 108 communicating with end opening 104 to secure instrumentality 30 to finger 102 particularly during lifting and shifting operations.

(b) After element 20 has been sheared from frame 22 by blades 24 and before nest 40 shifts back to its loading station 52, finger 102 lifts element 20 up through open center 92 of cutter frame 84.

Figure 5:
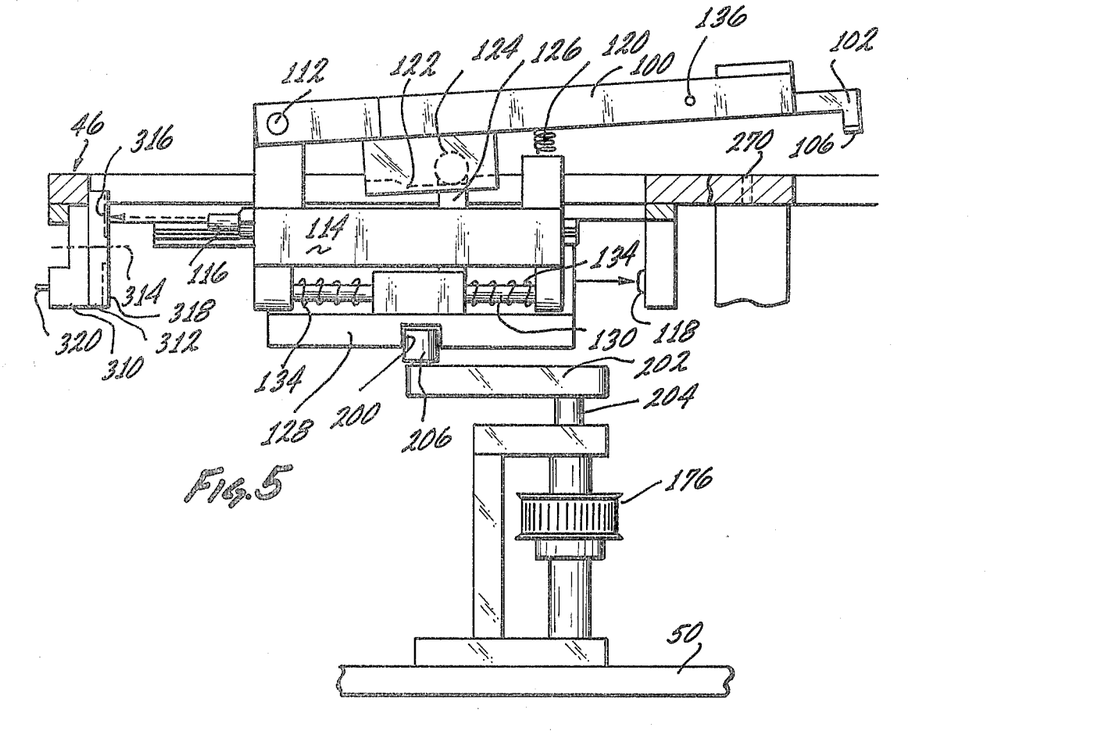
FIG. 5 is an elevational view, partly in section and on enlarged scale, of a moving transfer arm assembly.
Figure 6:
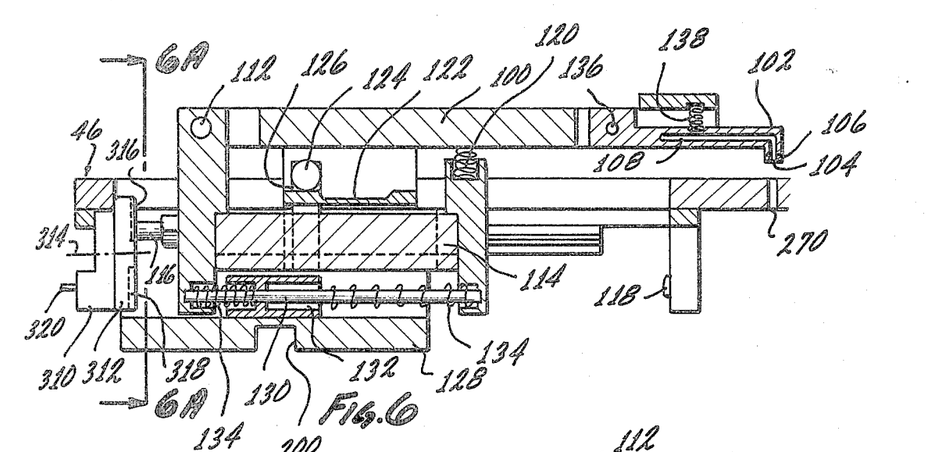
FIG. 6 is a view like FIG. 5 but taken primarily in section on line 6—6 of FIG. 3.
Figure 7:
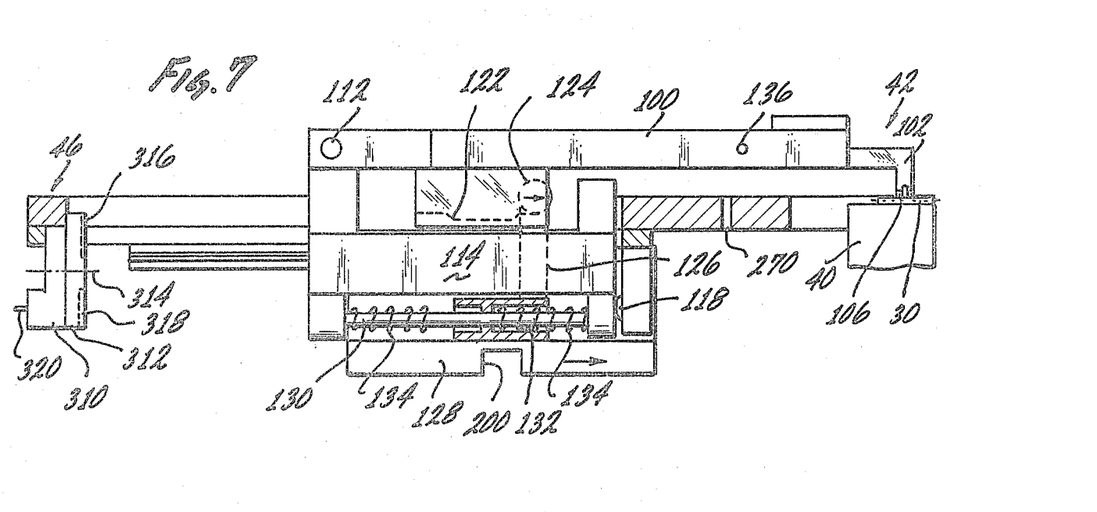
FIG. 7 is similar to FIG. 5 but with the moving transfer arm in a different position.
Figures 11, 12, 13:
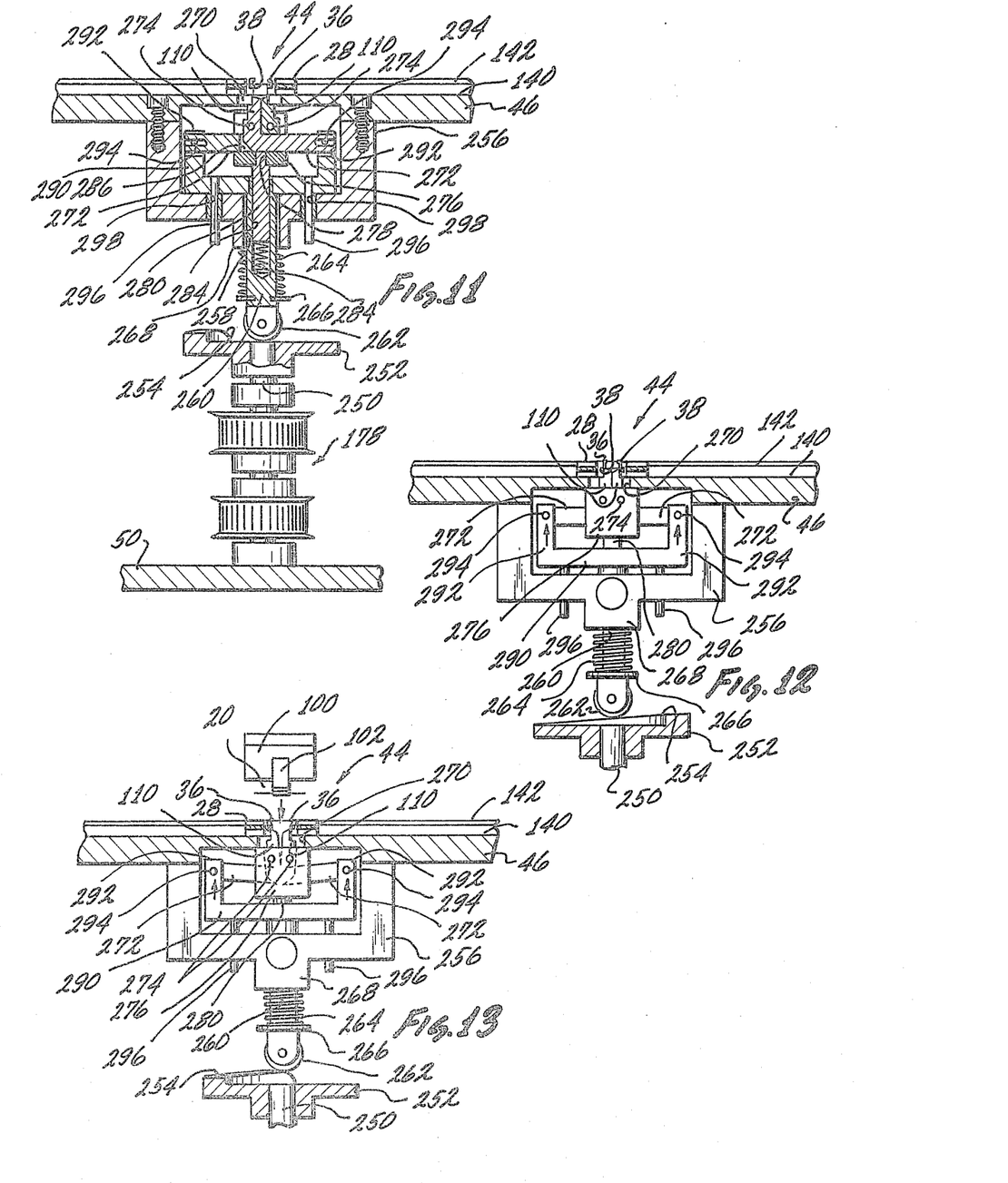
FIG. 11 is an elevational view taken partly in section on line 11—11 of FIG. 2.
FIG. 12 is similar to FIG. 11 but with parts in a different position.
FIG. 13 is similar to FIG. 12 but with parts in a different position.

(c) Next arm 100 travels to the left as viewed in FIGS. 5-7 until finger 102 is disposed above a carrier 28 at the packing station 44. In the meantime, a pair of upstanding spreader fingers 110 at the packing station have raised from the FIG. 11 position to the FIG. 12 position between the parallel bars 38 of carrier 28 and have spread bars 38 as shown in FIG. 13 so that opposed lugs 36 on bars 38 are spread far enough apart to pass central instrumentality 30 of element 20.

(d) Finger 102 moves element 20 down in place in carrier 28.

(e) Upstanding spreader fingers 110 close and then draw downwardly. When spreader fingers 110 move together (to the position shown in FIG. 12), they release bars 38 and lugs 36 move toward each other gripping opposite edges of central integrated circuit instrumentality 30, thereby securing element 20 within carrier 28, as shown in FIG. 6B.

(f) At this point, the cycle of arm 100 and depending finger 102 is ready to repeat step (a) above.

Figure 6A:
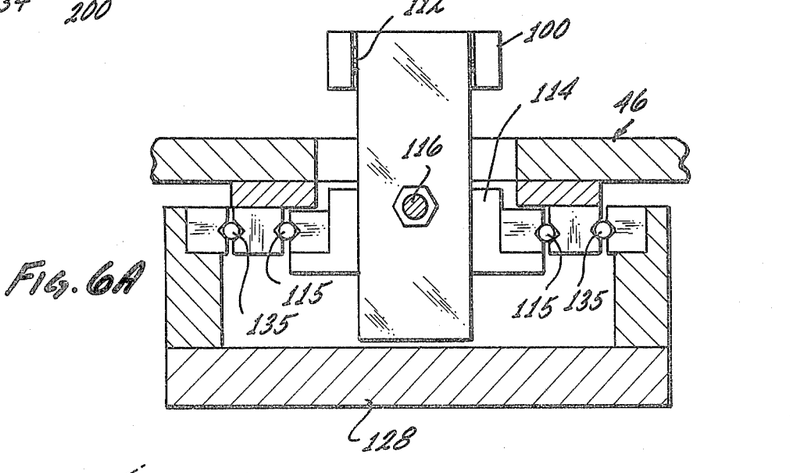
FIG. 6A is an elevational view taken primarily in section on line 6A—6A of FIG. 6.
Figure 6B:
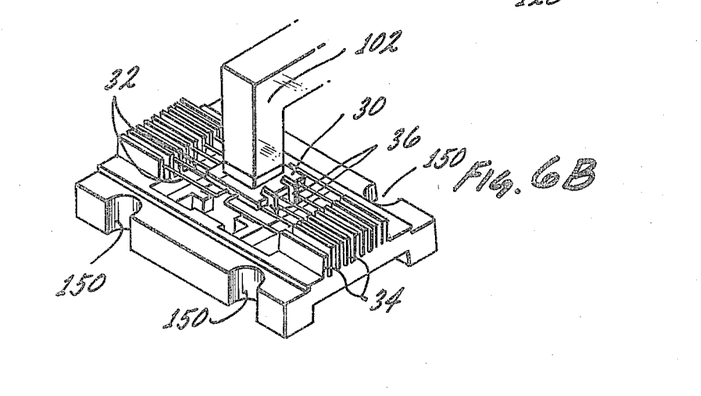
FIG. 6B is a perspective view showing the packing of a separated integrated circuit element into a carrier by a depending finger on the end of the transfer arm.

To now more specifically describe the mechanisms associated with transfer arm 100, one end of arm 100 is pivotally connected at 112 to an underlying mounting block 114 which has a double slide antifrictional mounting 115 as shown in FIG. 6A. Stop abutments 116, 118 represent limits of movement of block 114 left and right as viewed in FIGS. 5-7 and in FIG. 1. Abutment 116 is indicated to be threadedly adjustable. A spring 120 normally presses the free end of arm 100 upwardly. A cam track 122 attached to arm 100 and a roller cam follower 124 controls the downward pivoting of the free end of arm 100 against the pressure of compression spring 120. It will be noted that cam track 122 has a high portion at each end so as to depress the free end of arm 100 in the FIG. 6 and FIG. 7 positions (when finger 102 is being pressed down into carrier 28 at the packing station 44 in FIG. 6 and when finger 102 is being pressed down into nest 40 in the cutting station 42 in FIG. 7). Cam track 122 has a low central section which permits the free end of arm 100 and finger 102 to pivot up during the movement of finger 102 illustrated in FIG. 5 between packing station 44 and cutting station 42. Roller cam follower 124 is attached to an arm 126 upstanding from an undercarriage 128.

Undercarriage 128 has a lost motion connection with mounting block 114 by means of a rod 130 attached to traveling block 114 and extending through an opening 132 in undercarriage 128 and a compression spring 134 on rod 130 at each side of opening 132. The lost motion connection means that undercarriage 128 is driven and carries traveler in step until abutment 116 or 118 is reached. Note in FIG. 7, the right abutment 118 stops traveling block 114 but undercarriage 128 continues to the right producing relative motion of follower 124 and cam 122 thereby pressing the depending finger 102 into nest 40 at cutting station 42. In FIG. 6, the left abutment 116 stops block 114 but undercarriage 128 continues to the left producing relative motion of follower 124 and cam 122 thereby pressing the depending finger 102 into carrier 28 at packing station 44.

Undercarriage 128 has double slide antifrictional mounting 135 as illustrated in FIG. 6A. Finger 102 is pivotally connected to arm 100 at 136 and there is a spring 138 between finger 102 and arm 100 whereby depending finger 102 will resiliently give as it is pressed down into nest 40 at cutting 42 and into carrier 128 at packing station 44.

Carriers 28 are fed in a slideway 140 with overhanging flanges 142 and pushed into place into packing station 44 with an oil impregnated plastic plate-like slide 144. Flanges 142 overhang the edges of carriers 28 to retain them in proper orientation. Carriers 28 may be fed into slideway 140 from a magazine 146 of a cross-section shown in FIGS. 3 and 14, except the cross-section is relieved at the level of slideway 140, where bosses 148 are removed so as not to interfere with the feeding of the bottommost carrier 28 down slideway 140 upon each reciprocating movement of slide 144. The bosses 148 fit into recesses 150 in carriers 28 in the upper part of magazine 146 so that carriers 28 can fit into magazine 146 only in proper orientation. At the other end of guideway 140, carriers 28 can drop into a receiving magazine 152. A mechanism instead could be provided to upwardly feed carriers 28 into an upstanding receiving magazine, if desired. Feeding of carriers 28 to slideway 140 or otherwise to packing station 44 instead could come from a vibratory, carrier orienting bowl. Handfeeding would also be feasible but it is an objective of my equipment to minimize hand operations.

Figure 15:
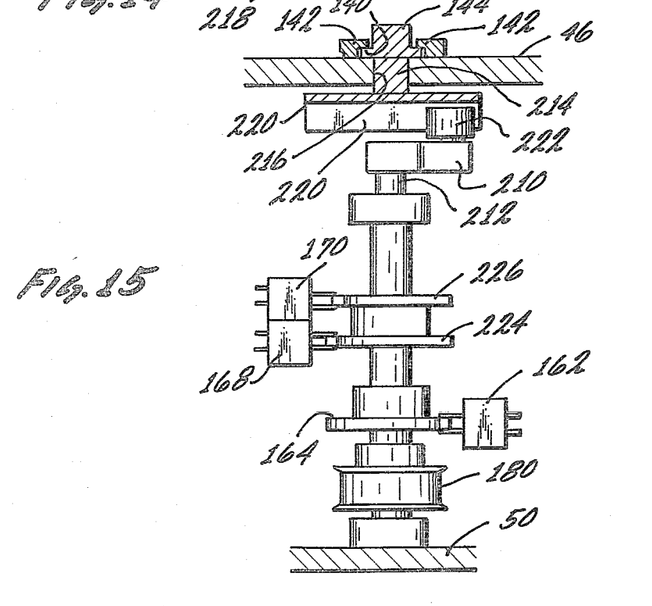
FIG. 15 is an elevational view, partly in section, of some other details particularly in operating mechanisms.
Figures 16, 17:
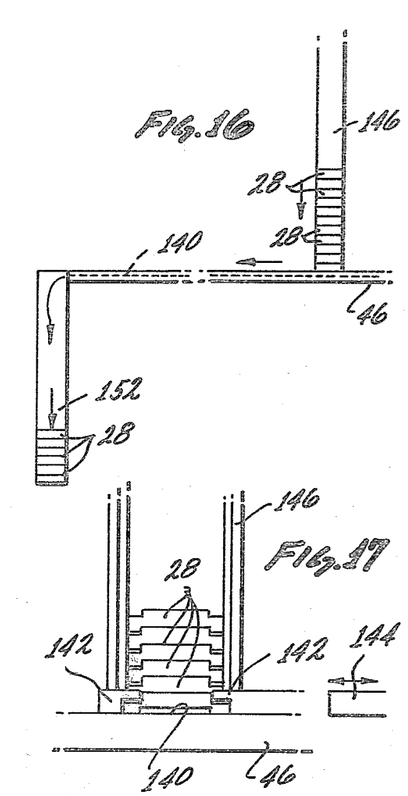
FIG. 16 is a schematical elevational view of carrier feeding and receiving magazines in use with the equipment.
FIG. 17 is an enlarged partial schematical elevational view of the carrier feeding process.
Figure 18:
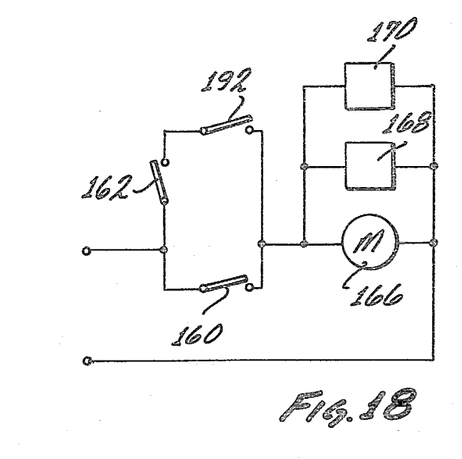
FIG. 18 is a diagram of primary electrical elements.

I will now describe the operating system for my equipment, referring first to FIG. 18. Preferably, the equipment completes a cycle automatically upon initiation by a foot pedal and switch 160 (which is depressed and then let up). The depression of pedal 160 starts a cycle which is terminated by a switch 162 which is controlled by a cam 164 on shaft 212 (see FIG. 15). It will be understood by those skilled in the art that cam 164 will not open switch 162 until operating mechanisms have reached the end of a cycle. Switch 160 is normally open but is closed by the foot pedal depression long enough to run motor 166 to rotate shaft 212 (through a series of belts and sheaves) far enough to cause cam 164 to shut switch 162 until the end of the cycle. Switches 160, 162 are wired in parallel. While current is being supplied to the circuit, motor 166 is operated and powers motion of parts. Motor 166 also indirectly drives other cams on shaft 212 that control air switch 168 and vacuum switch 170, which govern use in the equipment of air and vacuum from plant sources. If plant air or vacuum were not available, those skilled in the art will understand how to incorporate air or vacuum generating sources in the equipment and system. Air or vacuum instead could have valves for their control which are mechanically operated instead of electrically controlled.

Motor 166 provides power to operating units through a series of sheaves at 172, 174, 176, 178, 180, 182 connected by belts 184, 185, 186, 188, 190. Sheave 172 is at the end of the motor shaft. Sheave 174 is part of a torque limiting device, including switch 192 in the circuit shown in FIG. 18, which will shut off the equipment if overload occurs. It will be understood there could be one sheave or two superposed sheaves as locations 176, 178, and 180 to transfer movement from one belt to another.

Figure 4:
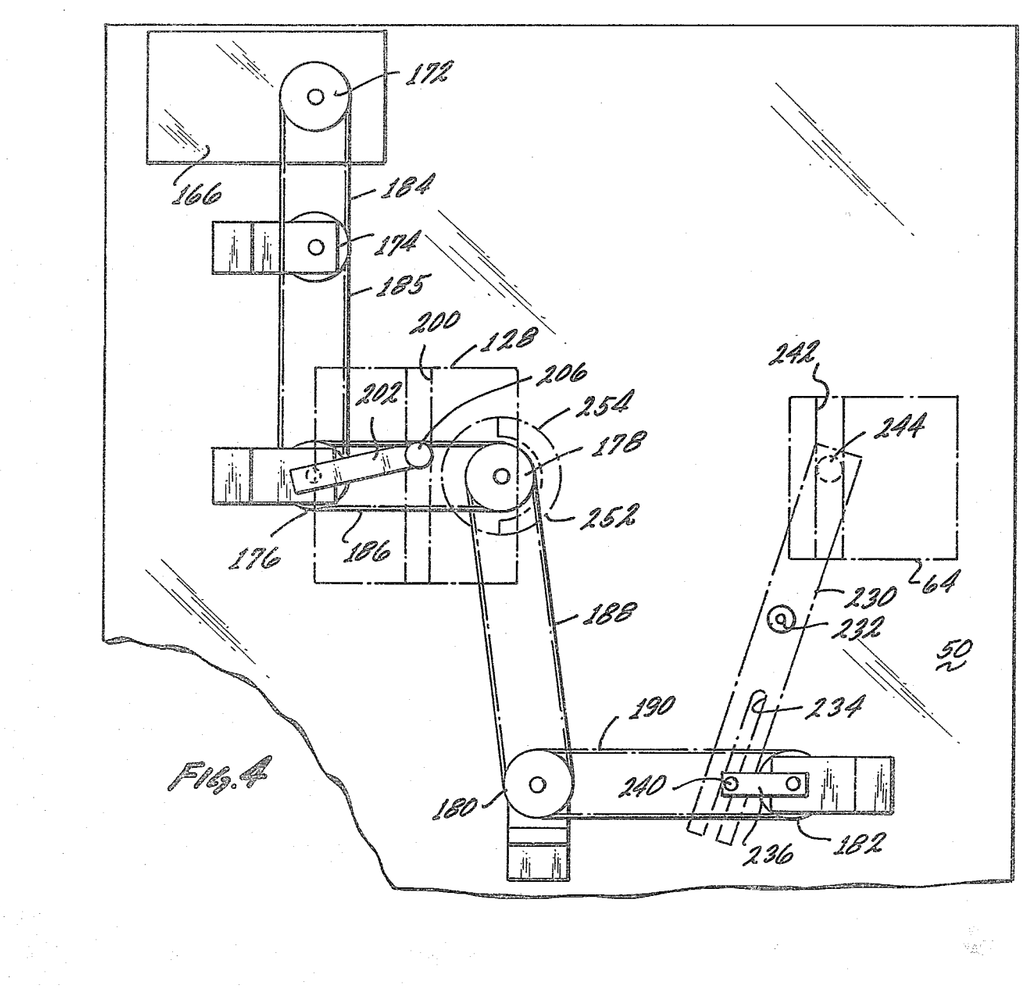
FIG. 4 is a plan view somewhat like FIG. 3 but partly in section and showing some of the operating mechanisms involved in my invention.

Referring particularly to FIGS. 4 and 5, undercarriage 128 has a lateral slot 200. A crank arm 202 is mounted on a shaft 204 and rotates responsive to rotation of a sheave at site 176. A roller 206 at the end of crank arm 202 acts in slot 200 so that undercarriage 128 reciprocates responsive to rotation of shaft 204.

Figure 3:
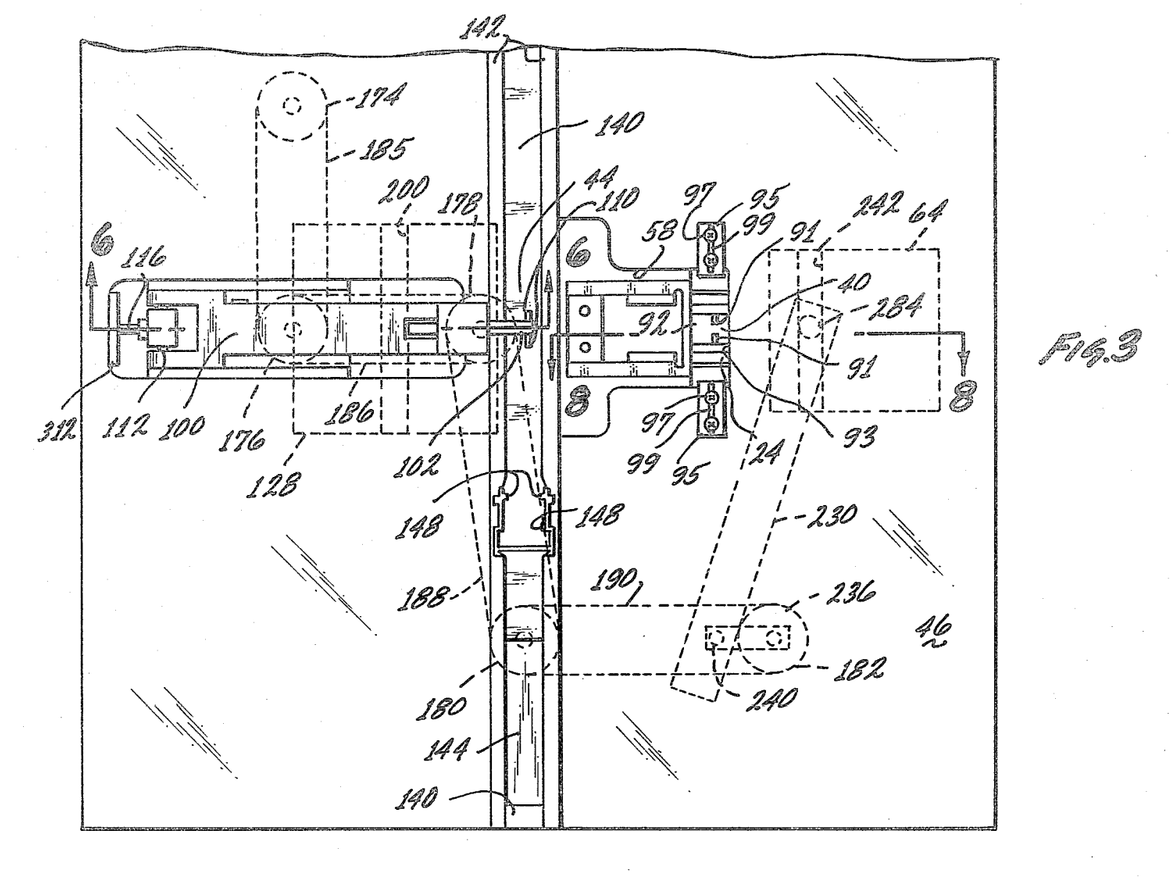
FIG. 3 is a partial plan view of the same.
Figure 14:
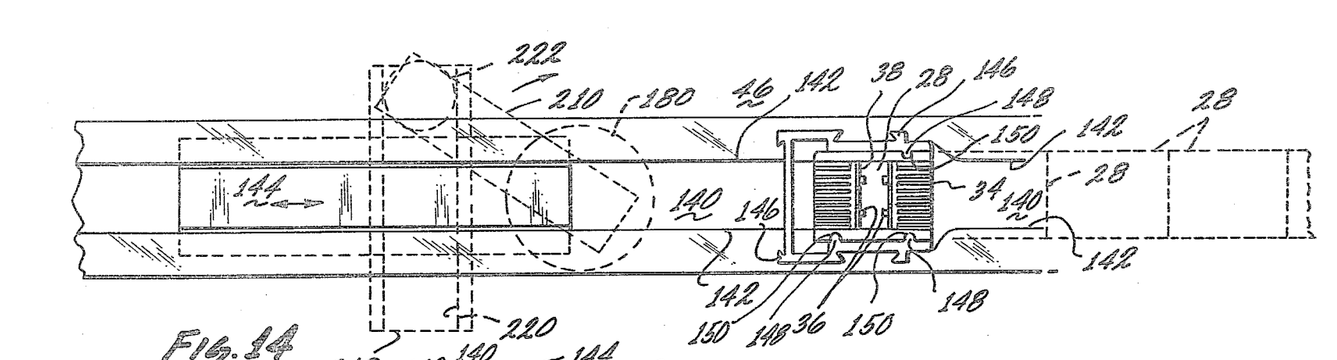
FIG. 14 is a partial plan view, on enlarged scale, of certain details.

Referring particularly to FIGS. 3 and 14, a crank arm 210 is pivoted responsive to rotation of a sheave at site 180 attached to a shaft 212. Slide 144 has a depending member 214 extending through a slot 216 in table 46 and attached to a guide 218 having a slot 220 extending laterally of the reciprocating travel of slide 144. A roller 222 on the end of arm 210 fits in slot 216, so that as sheave 180 rotates, crank arm 210 rotates and slide 144 reciprocates. In addition to cam 164, shaft 212 also has cams 224, 226 to operate switches 168, 170 controlling valves for air and vacuum supplies 300, 302.

Referring particularly to FIGS. 3, 4, and 8, an arm 230 is pivotally mounted on a stand 232 and has a longitudinal slot 234 at one end. The sheave at site 182 has a crank arm 236 mounted on a shaft 238 which rotates with sheave 182. A roller 240 fits in slot 234 whereby arm 230 pivots back and forth as sheave 182 rotates. Undercarriage 64 has a lateral slot 242 and a roller 244 on the other end of arm 230 fits in slot 242, whereby undercarriage 64 reciprocates as arm 230 pivots back and forth.

Referring now to particularly FIGS. 4 and 11-13, two sheaves are shown at site 178. At least one of these sheaves is fixed to a shaft 250 to which is secured a disc 252 with an annular cam track 254. A bracket 256 secured underneath table 46 has a central opening 258 through which extends a rod-shaped cam follower 260 having a roller 262 at its lower end bearing on cam track 254. Rod 260 is downwardly pressed by a compression spring 264 acting between a washer 266 and a boss 268 on bracket 256. Table 46 has an opening 270 through which upstanding spreader fingers 110 can be raised into the space between parallel bars 38 of a carrier 28. Fingers 110 are each formed by the short leg of an L-shaped arm 272 which is pivotally mounted at 274 to a block 276. Block 276 has a bore 278 receiving the upper end of a plunger 280 set in a counterbore 282 in rod-shaped cam follower 260. A compression spring 284 set in the base of counterbore 282 means that plunger 280 is normally held in an upper position pressed against L-shaped arms 272 near their bends. Plunger 280 normally holds L-shaped arms 272 in the positions shown in FIGS. 11 and 12 but permits L-shaped arms 272 to bend to the positions shown in FIG. 13 when roller 262 on cam follower 260 reaches the highest point in cam track 254, in which case the corner portions 286 of L-shaped arms 272 act on plunger 280 to depress the same against the force of spring 284. A U-shaped support 290 has two upstanding arms 292 making pivotal slotted connections at 294 to the longer legs of L-shaped arms 272. Cam follower 260 applies force to raise L-shaped arms 272 through U-shaped support 290. Support 29 is stabilized by a pair of depending rods 296 extending through openings 298 in bracket 256.

Air supply is indicated in FIG. 2 at 300 and vacuum supply is indicated at 302. The switches 168, 170 controlling vacuum and air supply responsive to rotation of cams 224, 226 have been illustrated in FIG. 15 and have been previously described. Air from supply 300 is outletted to the area of nest 40 to blow away discarded frame elements 26 after they are sheared from flatpack frame 22 by blades 24, and this function is symbolized in FIG. 1A by nozzle 304. In connection with with FIG. 6, I have described vacuum passageway 108 and end opening 104 in depending finger 102 and the function of the vacuum in the operations. Vacuum supply 302 can be connected to passageway 108 in a suitable way, such as a flexible tube connected to passageway 108. Cam 226 should operate on switch 170 to shut off vacuum to vacuum passageway 108 in finger 102 before finger 102 rises after depositing an integrated circuit element 20 in a carrier 28, to prevent pulling element 20 back out of carrier 28, which could occur on occasion if vacuum were not terminated.

At the left hand end of the travel of carriage 114 in FIGS. 2, 5, 6, and 7 is shown an adjustable abutment 310 which has a pivotal member 312 pivotal about an axis 314 to expose either an abutment area 316 or 318 to stop 116. Spring-pressed pin 320 secures member 312 so that either area 316 or 318 is aligned with stop 116. The adjustment of abutment 310 compensates for differences in low integrated circuit elements 20 mate with carriers 28 depending on whether there is an odd or even number of leads 32 on opposite sides of instrumentality 30.

Figures 21, 22:
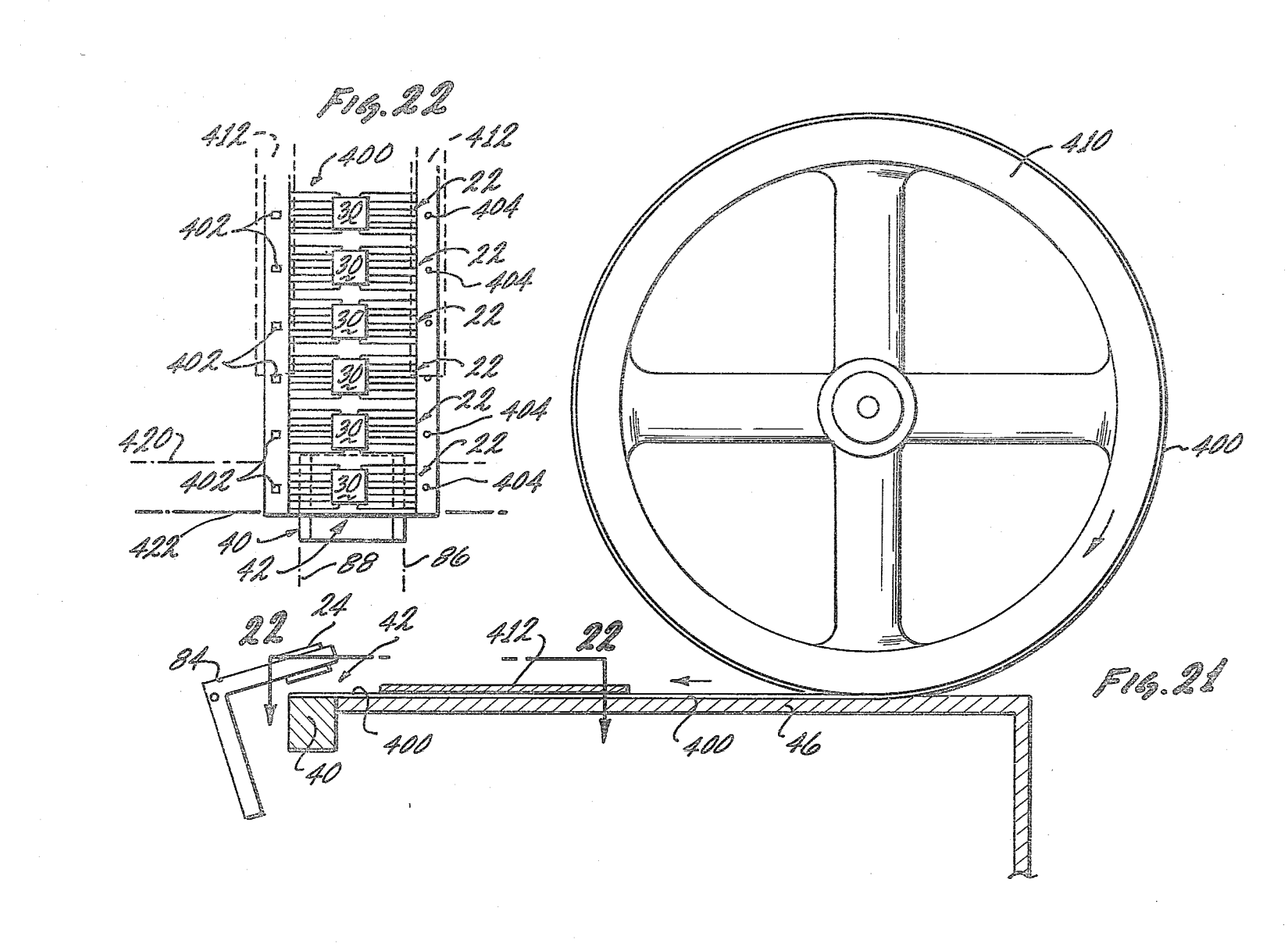
FIG. 21 is a schematical elevational view showing strip feed of an integral flatpack frame from a reel.
FIG. 22 is a schematical plan view showing strip feed, taken generally on line 22—22 of FIG. 21.

FIGS. 21 and 22 illustrate the feeding of a strip 400 of integral flatpack frames 22. Strip 400 is representative of the way frames 22 are manufactured. The separate flatpack frames 22, such as is illustrated in FIG. 1A, are cut from such strips or reels 400. The square and round openings 402, 404 adapt strips 400 for sprocket feed. Openings 402, 404 can be used to feed strips 400 in my equipment, whether a rectilinear strip is rectilinearly fed or whether the strip is fed off a sprocketed reel 410 as rather schematically illustrated in FIG. 21. Those skilled in the art will understand how to feed a long strip 400 off of a reel 410 or to feed a shorter section strictly rectilinearly. Sprocketed feed, such as is found in movie cameras, is applicable to the movement of strip 400.

Reel 410 feeds strip 400 into a guideway on table top 46 defined by side abutting and overlying flanges 412 on either side of strip 400. Rest 40 is stationary when frames 22 are fed in a strip 400 and is located at cutting station 42. Cutting mechanism 84 is the same as in the other figures except that blades 24 may be configured to cut strip 400 on lines represented by planes 420, 422, in addition to planes represented by lines 86, 88, in order to cut up the sides of strip 400 for ready disposal by being blown away from the cutting area.

From the foregoing description, my means and method of processing flatpack frames to pack integrated circuit elements in carriers will be understood. I wish to cover those modifications thereof which will occur to those skilled in the art upon learning of my invention and that are properly within the scope of my invention.

I claim:

1. The method of separating an integrated circuit element from an integral flat pack frame and inserting it in a carrier, comprising:
   (a) delivering said frame to a cutting station with said integrated circuit element in a selected clocked orientation,
   (b) separating said integrated circuit element from said frame thereby forming a separated integrated circuit element,
   (c) positioning a carrier at a packing station and transferring said separated integrated circuit element from said cutting station to said packing station while maintaining said selected clocked orientation by picking it up out of said cutting station by generally vertical movement, moving it generally horizontally to above said packing station, and putting it down into said carrier at said packing station by generally vertical movement, and
   (d) accomplishing the above in a continuous cycle of operations from start to finish.

2. In the process of claim 1, holding said integrated circuit element in said cutting station by downward pressure while separating said integrated circuit element by shearing.

3. In the process of claim 1 holding said separated integrated circuit element by applying a vacuum thereto during movement from said cutting station to said packing station.

4. In the process of claim 1, said integrated circuit element having a central integrated circuit instrumentality and a series of leads extending from opposite sides thereof, said carrier having means to secure said separated integrated circuit element in the form of opposed lugs to engage opposite edges of said central integrated circuit instrumentality, and spreading said lugs while said separated integrated circuit element is being put down into said carrier at said packing station and then releasing said lugs to engage said central instrumentality.

5. In the process of claim 1, delivering said frame to said cutting station in the form of one of a series of flat pack elements arranged serially in a strip.

6. In the process of claim 1, forming a nest and locating said nest at a receiving location and depositing said integrated circuit element in said nest at said receiving location with said integrated circuit element in said selected clocked orientation and transferring said nest from said receiving location to said cutting station while preserving said selected clocked orientation.

7. The method of separating an integrated circuit element from an integral flatpack frame and inserting it in a carrier, said integrated circuit element having a central integrated circuit instrumentality and a series of leads extending from opposite sides thereof, said carrier having means to secure said separated integrated circuit element in the form of opposed lugs to engage opposite edges of said central instrumentality, comprising:
   (a) delivering said frame to a cutting station with said integrated circuit element in a selected clocked orientation,
   (b) holding said integrated circuit element in said cutting station by downward pressure while separating said integrated circuit element from said frame by shearing thereby forming a separated integrated circuit element,
   (c) positioning a carrier at a packing station and transferring said separated integrated element from said cutting station to said packing station while maintaining said selected clocked orientation including holding said separated integrated circuit element by applying a vacuum to said central instrumentality during movement from said cutting station to said packing station and including picking said separated element up out of said cutting station by generally vertical movement, moving it generally horizontally to above said packing station, and putting it down into said carrier at said packing station by generally vertical movement while spreading said lugs while said separated element is being put down into said carrier and then releasing said lugs to engage said central instrumentality, and (d) accomplishing the above in a continuous cycle of operation from start to finish.

8. The improvement in means for processing an integrated circuit element singly formed within an integral flatpack frame by separating the integrated circuit element from the frame and inserting the integrated circuit element in a selected clocked orientation into a carrier, said integrated circuit element having a central integrated circuit instrumentality and a series of leads extending from opposite sides of said instrumentality, comprising:

(a) a cutting station and delivery means, both of said station and said delivery means being mounted on structure means, said delivery means operative to deliver said frame to said cutting station with said integrated circuit element in said selected clocked orientation, (b) shearing means mounted on said structure means and located at said cutting station operative to separate said integrated circuit element from said frame and thereby to form a separated integrated circuit element, (c) a packing station and a carrier, both of said packing station and said carrier being mounted on said structure means, said carrier positioned at said packing station and packing means operative to transfer said separated integrated circuit element from said cutting station to said packing station and to pack said separated integrated circuit element into said carrier while maintaining said selected clocked orientation, and (d) control means automatically sequentially operating said delivery, shearing and packing means in each cycle of operation.

9. The subject matter of claim 8 in which said delivery means includes a nest to receive said frame singly at an initial receiving location and coacting locating means including index means that is clocked so that said frame will fit in said nest in only one clocked orientation and said delivery means including shifting means to shift said nest from said receiving location to said cutting station to deliver said frame with said integrated circuit element in said selected clocked orientation.

10. The subject matter of claim 9 in which said locating and indexing means includes a pair of spaced blades upstanding from said nest and disposed in an upright plane, said blades being disposed between adjacent leads and abutting said opposite sides of said integrated circuit instrumentality, a first abutment and a second abutment engaging opposite ends of said frame and said integrated circuit instrumentality being closer to one end of said frame than the other end of said frame and said abutments being located with one abutment closer to said blades than the other abutment so that said integral flatpack frame will fit only between said blades and said abutments when it has said selected clocked orientation.

11. The subject matter of claim 10 in which there is a third abutment for one side of said integral flatpack frame at said initial receiving location that determines which adjacent leads said blades fit between.

12. The subject matter of claim 9 in which said shifting means horizontally reciprocates said nest rectilinearly between said initial receiving location and said cutting station, said shearing means including a movable cutting frame having a plurality of cutters arranged on opposite sides thereof, the spacing of said cutters defining the desired cut of said integrated circuit element from said flatpack frame, said cutting frame moving between an upper position permitting entrance of said nest into said cutting station and departure therefrom and a lower position separating said integrated circuit element from said flatpack frame.

13. The subject matter of claim 12 in which said shifting means includes a carriage upon which said nest is mounted and means supporting said carriage for rectilinear reciprocation and an undercarriage and means slidably connecting said undercarriage to said carriage to move between first and second relative positions of carriage and undercarriage and spring means normally urging said undercarriage to said first position, said control means including a pivotally mounted lever connecting to said undercarriage and means powering said lever so as to move said nest, carriage and undercarriage between said initial receiving station and said cutting station and said undercarriage acting on said movable cutting frame to move it from said upper position to said lower position to separate said integrated circuit element from said frame after said nest has been moved to said cutting station by movement of said undercarriage relative to said carriage from said first to said second position against the resistance of said spring means.

14. The subject matter of claim 12 in which said cutter frame has an open center and said packing means includes a transfer arm having a depending finger at one end and means to move and pivot said transfer arm so that said finger moves in a cycle of operation from a first position extending down through said open center of said cutting frame to hold said integrated circuit element in place in said nest at said cutting station while it is being separated from said flatpack frame, through a movement picking up said separated integrated circuit element and withdrawing it upwards through said open center of said cutting frame and moving it over said carrier and moving said finger down to a second position in which said separated integrated circuit element is inserted into place in said carrier, the cycle of operation of said finger also including movement of said finger from said second position back to said first position, and a vacuum line through said arm to the end of said finger for securing said separated integrated circuit element to said finger by vacuum during movement of said finger from said first to said second position thereof.

15. The subject matter of claim 14 in which said packing means includes a carriage upon which said transfer arm is pivotally mounted and means supporting said carriage for rectilinear reciprocation and an undercarriage and means slidably connecting said undercarriage to said carriage to move between first and second relative positions of carriage and undercarriage and spring means normally urging said undercarriage to said first position, said control means including a pivotally mounted lever connecting to said undercarriage and means powering said lever so as to move said transfer arm between said first and second positions of said finger, there being a two-position adjustable abutment limiting the movement of said carriage relative to said second position of said finger in packing said separated integrated circuit element, said two-position abutment adjusting for numbers of leads, said undercarriage tending to move relative to said carriage from said first to said second relative position thereof to press said carriage against said abutment irrespective of which position said abutment has.

16. The subject matter of claim 14 in which said packing means includes a carriage upon which said transfer arm is pivotally mounted and means supporting said carriage for rectilinear reciprocation and an undercarriage and means slidably connecting said undercarriage to said carriage to move between first and second relative positions and an intermediate relative position of carriage and undercarriage and spring means normally urging said undercarriage to said intermediate position, said control means including a pivotally mounted lever connecting to said undercarriage and means powering said lever so as to move said transfer arm between said first and second positions of said finger, spring means tending to pivot said transfer to an upper position, said transfer arm and said undercarriage having a cam track on one and an arm with a cam follower bearing on said cam track on the other and said cam track having such contour as to depress said finger at said first and second positions of said finger by relative movement between said carriage and undercarriage from said intermediate relative position to said first and second relative positions thereof.

17. The subject matter of claim 8 in which said carrier has means to secure said separated integrated circuit element in the form of opposed lugs on spaced bars to engage opposite edges of said central instrumentality of said separated integrated circuit element and a pair of spreader fingers extending upwardly between said bars and means to spread said spreader fingers and said bars therewith as said packing means packs said separated integrated circuit element into said carrier.

18. The subject matter of claim 17 in which said control means includes a disc with a circular cam track thereon and means to rotate said disc during each cycle of operation, a cam follower bearing on said cam track and lever means connecting between said cam follower and said spreader fingers whereby before said separated integrated circuit element is deposited in said carrier said spreader fingers are raised from a lower position to an upper position between said bars and said spreader fingers are spread to spread said bars and whereby after said integrated circuit element is deposited in said carrier said spreader fingers are brought together and lowered to said lower position so said lugs engage opposite edges of said central integrated circuit instrumentality.

19. The subject matter of claim 8 in which there are a series of flat pack elements arranged serially in a strip and in which said delivery means includes strip feeding and guiding means including a reel supporting said strip and guide means guiding the end of said strip from said reel to said cutting station and in which delivery of said integrated circuit element in said selected clocked orientation is controlled by orientation of said integrated circuit elements on said strip.

20. The subject matter of claim 8 in which said packing means includes a transfer arm having a depending finger at one end and means to move and pivot said transfer are so that said finger moves in a cycle of operation from a first position engaging said central integrated circuit instrumentality at said cutting station, through a movement picking up said separated integrated circuit element and withdrawing it upwards and moving it over said carrier and moving said finger down to a second position in which said separated integrated circuit element is inserted into place in said carrier, the cycle of operation of said finger also including movement of said finger from said second position back to said first position, and a vacuum line through said arm to the end of said finger for securing said separated integrated circuit element to said finger by vacuum during movement of said finger from said first to said second position thereof.

* * * * *